United States Patent
Li et al.

(10) Patent No.: US 9,549,492 B2
(45) Date of Patent: Jan. 17, 2017

(54) CORRECTION MECHANISM FOR PIN AND CORRECTION DEVICE

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventors: Bing Li, Shenzhen (CN); Bo Yang, Shenzhen (CN)

(73) Assignees: HONG FU PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 962 days.

(21) Appl. No.: 13/854,158

(22) Filed: Apr. 1, 2013

(65) Prior Publication Data
US 2014/0007422 A1     Jan. 9, 2014

(30) Foreign Application Priority Data
Jul. 9, 2012    (CN) .......................... 2012 1 2353085

(51) Int. Cl.
*H05K 13/00*     (2006.01)
*H05K 3/00*     (2006.01)
(Continued)

(52) U.S. Cl.
CPC ........ *H05K 13/0092* (2013.01); *H05K 3/0008* (2013.01); *H05K 3/306* (2013.01);
(Continued)

(58) Field of Classification Search
CPC ............ H05K 13/0092; H05K 13/0439; H05K 13/026; Y10T 29/53183
(Continued)

(56) References Cited

U.S. PATENT DOCUMENTS

| | | | | |
|---|---|---|---|---|
| 3,404,712 A | * | 10/1968 | Suverkropp | ......... H05K 13/026 |
| | | | | 140/147 |
| 4,397,341 A | * | 8/1983 | Kent | ...................... H01R 43/20 |
| | | | | 140/147 |

(Continued)

FOREIGN PATENT DOCUMENTS

| | | | | |
|---|---|---|---|---|
| EP | 2233626 A1 | 9/2010 | | |
| GB | 1416299 A | * 12/1975 | ........... H05K 13/026 |
| TW | 437123 | 5/2001 | | |

*Primary Examiner* — Livius R Cazan
(74) *Attorney, Agent, or Firm* — Zhigang Ma

(57) ABSTRACT

A correction mechanism includes a mounting board, a first correction assembly, and a second correction assembly. The first correction assembly includes a plurality of first limiting members and a plurality of first correction members alternating arranged with the plurality of first limiting members. The first limiting members are securely fixedly mounted on the mounting board. The first correction members are movably mounted on the mounting board and capable of moving toward the plurality of first limiting members along a first direction. The second correction assembly has a structure similar to the first correction assembly. The plurality of second limiting members and the plurality of second correction members are substantially perpendicular to and above the plurality of first limiting members and the plurality of first correction members

20 Claims, 3 Drawing Sheets

(51) Int. Cl.
   *H05K 13/04* (2006.01)
   *H05K 13/02* (2006.01)
   *H05K 3/30* (2006.01)

(52) U.S. Cl.
   CPC ....... *H05K 13/026* (2013.01); *H05K 13/0439* (2013.01); *H05K 2203/166* (2013.01); *Y10T 29/53209* (2015.01)

(58) Field of Classification Search
   USPC .......................................................... 140/147
   See application file for complete search history.

(56) References Cited

U.S. PATENT DOCUMENTS

| | | | | |
|---|---|---|---|---|
| 4,643,234 A | * | 2/1987 | Alemanni | H05K 13/026 140/140 |
| 4,789,011 A | * | 12/1988 | Moloney | H05K 13/023 140/147 |
| 5,123,457 A | * | 6/1992 | Porter | H05K 13/026 140/147 |

* cited by examiner

CORRECTION MECHANISM FOR PIN AND CORRECTION DEVICE

BACKGROUND

1. Technical Field

The present disclosure relates to correction mechanism, and particularly to a correction mechanism for pins used for correcting pin alignments, and a correction device including the same.

2. Description of Related Art

A plurality of pins are formed on an electronic component. The circuit board defines a plurality of pin holes according to the pins. In assembly, the pins are inserted in the pin holes to electrically connect the electronic component to the circuit board. Because, the pins may be bent during conveying or during the testing process, the pins might not meet an assembly requirement. At this time, the alignment of the pins should be corrected by hand, which is time consuming.

Therefore, there is room for improvement in the art.

BRIEF DESCRIPTION OF THE DRAWINGS

The components in the drawings are not necessarily drawn to scale, the emphasis instead placed upon clearly illustrating the principles of the present disclosure. Moreover, in the drawings, like reference numerals designate corresponding parts throughout the several views.

DETAILED DESCRIPTION

Figure 1:
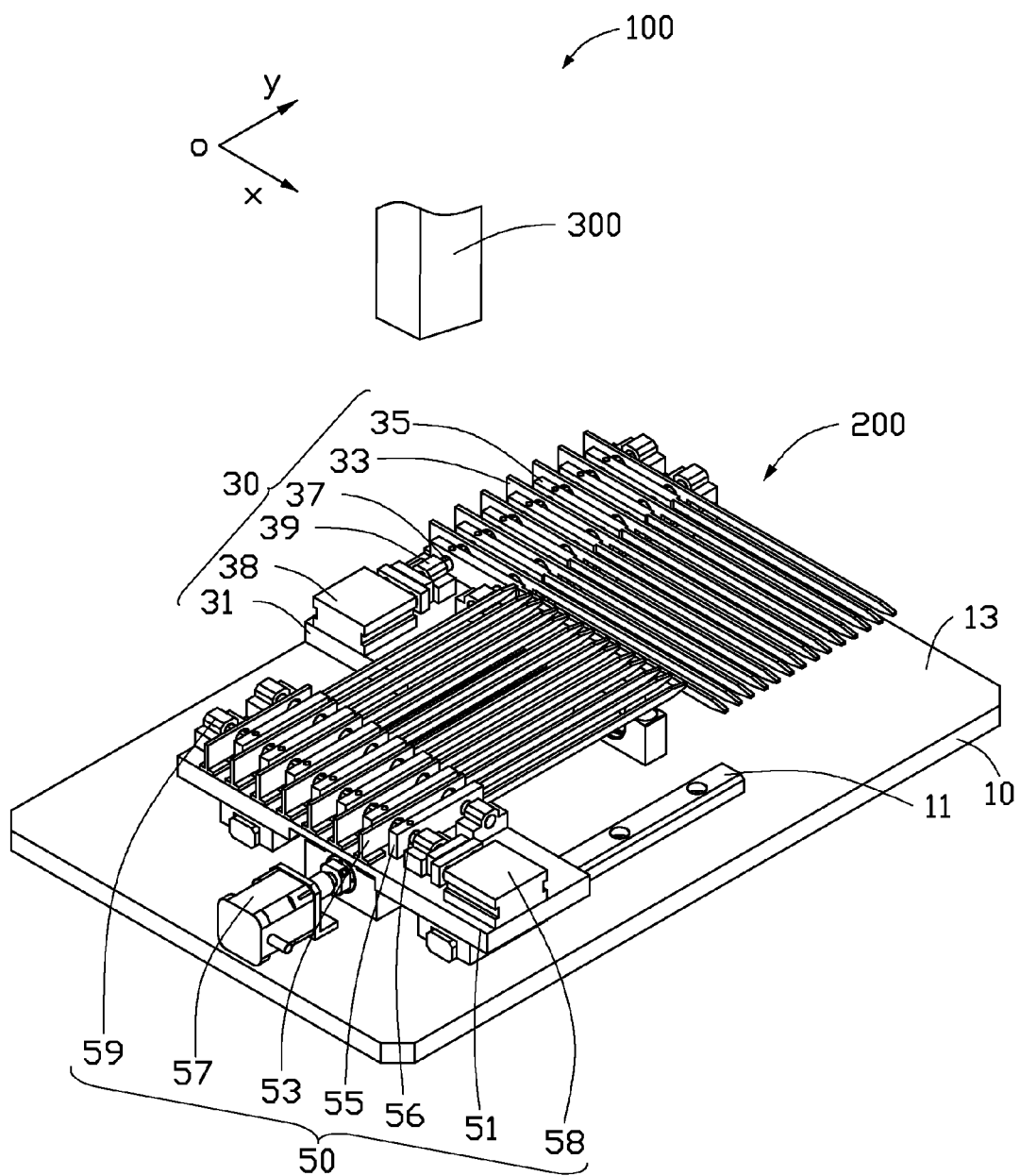
FIG. 1 is an isometric, assembled view of one embodiment of a correction device.

FIG. 1 shows a correction device 100 of one embodiment for correcting the alignment of pins of an electronic component (not shown). The correction device 100 includes a correction mechanism 200 and a pick-and-place mechanism 300 movably positioned above the correction mechanism 200. The correction mechanism 200 is configured for clamping the pins of the electronic component to correct the alignment of the pins. The pick-and-place mechanism 300 is configured for picking up the pins clamped by the correction mechanism 200 from the correction mechanism 200 and placing down the pins to be corrected on the correction mechanism 200. After picking up the pins from the correction mechanism 200, the alignment of the pins is corrected by a friction force exerted between the pins and the correction mechanism 200.

Figure 2:
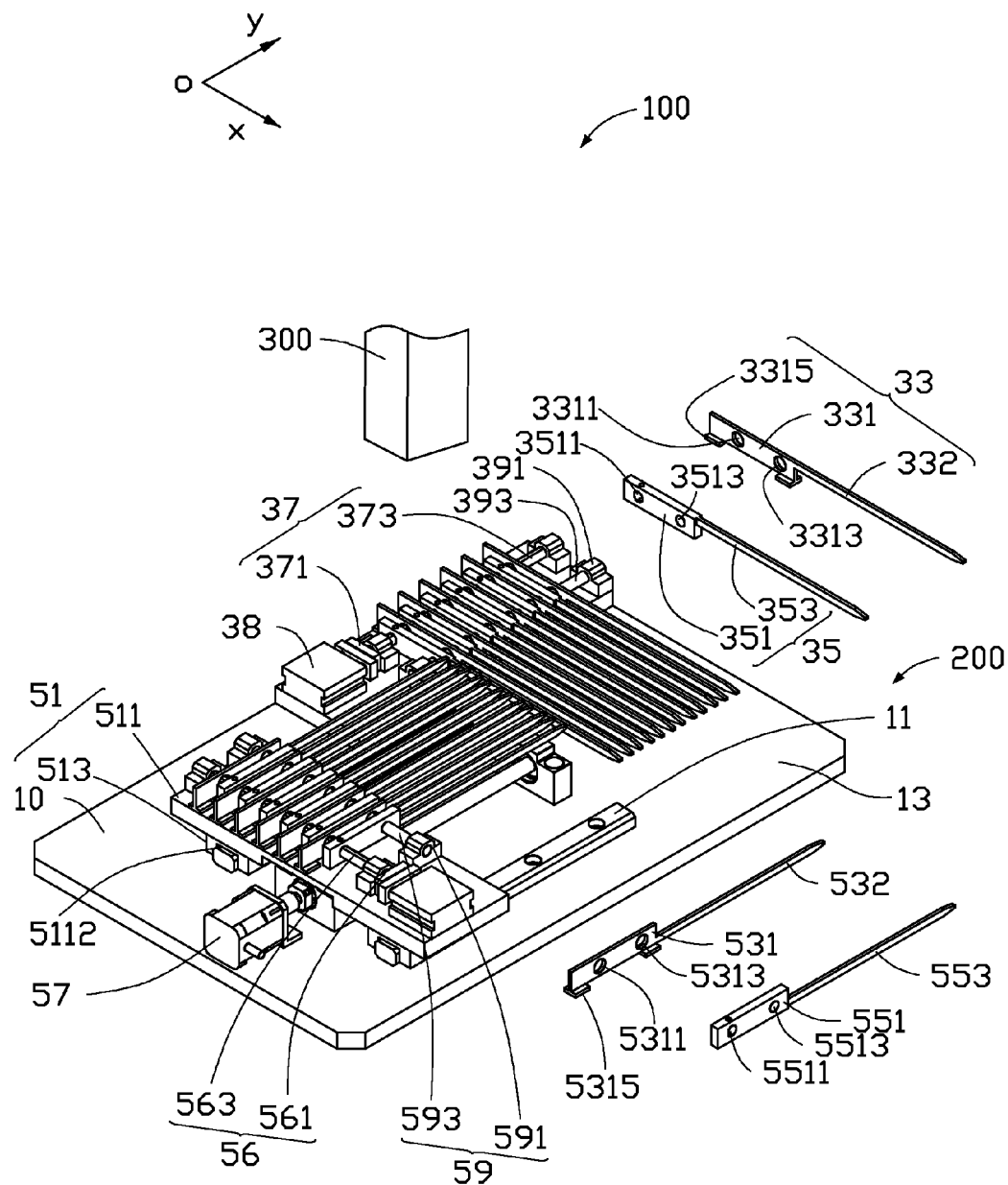
FIG. 2 is a partial, isometric, exploded view of the correction device of FIG. 1.
Figure 3:
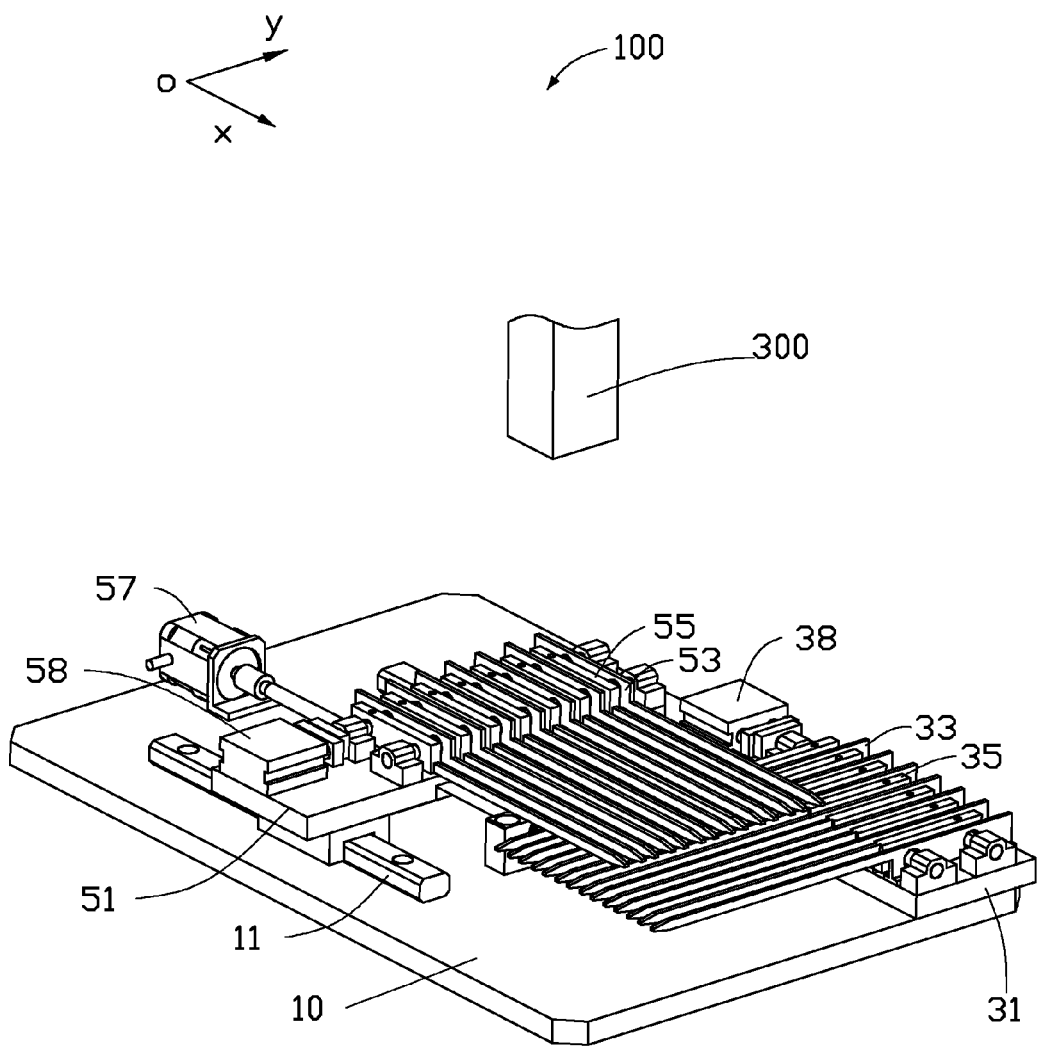
FIG. 3 shows a usage state of the correction device of FIG. 1.

FIGS. 2 and 3 show that the correction mechanism 200 includes a mounting board 10, a first correction assembly 30, and a second correction assembly 50. The first correction assembly 30 and the second correction assembly 50 are mounted on the mounting board 10, respectively. The first correction assembly 30 is arranged substantially perpendicular to the second correction assembly 50.

The mounting board 10 includes a main body 13 and two rails 11. The main body 13 is a substantially rectangular plate. The rails 11 are mounted on the main body 13 along a longitudinal direction.

The first correction assembly 30 is mounted on the main body 13 adjacent to one end of the rails 11. The first correction assembly 30 includes a support member 31, a plurality of first limiting members 33, a plurality of first correction members 35, a first transmission shaft 37, and a driving member 38. The support member 31 is securely fixedly mounted on one side of the main body 13. The first limiting members 33 are securely fixedly mounted on the support member 31, and are spaced from each other. Each first limiting member 33 is substantially L-shaped. Each first limiting member 33 includes a fixing portion 331, a first limiting portion 332 extending from a side surface of one end of the fixing portion 331 away from the support member 31, and two tabs 3315. The fixing portion 331 defines a first through hole 3311 and a second through hole 3313 spaced from the first through hole 3311. Each tab 3315 substantially perpendicularly extends from the other side surface of the fixing portion 331 opposite to the side surface from which the first limiting portion 332 is extending, adjacent to one end of the fixing portion 331. The two tabs 3315 are securely fixedly mounted on the support member 31.

The first correction members 35 are movably mounted on the support member 31 in an alternating arrangement with the first limiting members 33. Each first correction member 35 includes a mounting portion 351 and a first correction portion 353 extending from one side surface of one end of the mounting portion 351 away from the support member 31. The mounting portion 351 defines a first mounting hole 3511 and a second mounting hole 3513. The first correction portion 353 is aligned parallel to the first limiting portion 332. In the illustrated embodiment, the first correction assembly 30 includes seven first limiting members 33 and seven first correction members 35. A quantity of the first limiting members 33 and the first correction members 35 can be changed as needed.

The first transmission shaft 37 is substantially T-shaped. The first transmission shaft 37 includes a connection portion 371 and a transmission portion 373 substantially perpendicularly extending from the connection portion 371. The transmission portions 373 passes through the first through holes 3311 and the first mounting holes 3511, and the transmission portion 373 is fixed to inner walls of the first mounting holes 3511. Thus, the first transmission shaft 37 is securely connected to the first correction members 35. In other words, the first limiting members 33 are moveably mounted on the first transmission shaft 37, and the first correction members 35 are securely fixedly mounted on the first transmission shaft 37.

The driving member 38 is securely fixedly mounted on the support member 31, and is connected to the connection portion 371 of the first transmission shaft 37, such that the first correction members 35 connected to the connection portion 371 are capable of moving toward the first limiting members 33 driven by the driving member 38.

In the illustrated embodiment, the first correction assembly 30 further includes a first guiding subassembly 39. The first guiding subassembly 39 includes two pairs of mounting seats 391 mounted on the support member 31, and a first guiding shaft 393. One pair of the mounting seats 391 is positioned on opposite ends of the transmission portion 373, and the transmission portion 373 is movably mounted on the mounting seats 391 along the longitudinal direction. The other pair of the mounting seats 391 is securely positioned on opposite ends of the first guiding shaft 393. The first guiding shaft 393 passes through the second mounting hole 3513 and the second through hole 3313, and thus the first limiting members 33 and the first correction members 35 are mounted on the first guiding shaft 393. Thus, the first correction member 35 is guided by the first guiding shaft 393.

The second correction assembly 50 has a structure similar to the first correction assembly 30. The second correction assembly 50 includes a support member 51, a plurality of second limiting members 53, a plurality of second correction members 55, a second transmission shaft 56, a first driving member 57, a second driving member 58, and a second guiding subassembly 59. The support member 51 includes a main body 511 and two sliding portions 513 positioned in parallel on the main body 511. Each sliding portion 513 defines a sliding groove 5112 engaging with one of the rails 11. The second limiting members 53 are securely fixedly mounted on the main body 511, and are spaced from each other. Each second limiting member 53 includes a fixing portion 531, a second limiting portion 532 extending from a side surface of one end of the fixing portion 531 away from the support member 51, and two tabs 5315. The fixing portion 531 defines a first guiding hole 5311 and a second guiding hole 5313 spaced from the first guiding hole 5311. Each tab 5315 substantially perpendicularly extends from the other side surface of the fixing portion 531 opposite to the side surface from which the second limiting portion 532 is extending from, and adjacent to one end of the fixing portion 531. The tabs 5315 are securely fixedly mounted on the main body 511.

The second correction members 55 are movably mounted on the support member 51 in an alternating arrangement with the second limiting members 53. Each second correction member 55 includes a mounting portion 551 and a second correction portion 553 extending from one side surface of one end of the mounting portion 551 away from the support member 51. The mounting portion 551 defines a first mounting hole 5511 and a second mounting hole 5513. The second correction portion 553 is aligned parallel to the second limiting portion 532. In the illustrated embodiment, the second correction assembly 50 includes seven second limiting members 53 and seven second correction members 55. A quantity of the second limiting members 53 and the second correction members 55 can be changed as needed.

The second transmission shaft 56 includes a connection portion 561 and a transmission portion 563 substantially perpendicularly extending from the connection portion 561. The transmission portions 563 passes through the first mounting hole 5511 and the first guiding holes 5311, and the transmission portion 563 is fixed to inner walls of the first mounting holes 5511. Thus, the transmission shaft 56 is securely fixedly connected to the second correction members 55. In other words, the second limiting members 53 are movably mounted on the second transmission shaft 56, and the second correction members 55 are securely fixedly mounted on the second transmission shaft 56.

The first driving member 57 is securely fixedly mounted on the main body 13 of mounting board 10 between the two rails 11, and is connected to the support member 51, such that the support member 51 is capable of moving toward the first correction assembly 30 driven by the first driving member 57. In the illustrated embodiment, the first driving member 57 is a lead screw. In other embodiments, the first driving member 57 can be a cylinder. The second driving member 58 is securely fixedly mounted on the main body 511, and is connected to the connection portion 561. Thus, the second correction member 55 connected to the second transmission shaft 56 is capable of moving toward the second limiting members 53 driven by the second driving member 58.

In the illustrated embodiment, the second correction assembly 50 further includes a second guiding subassembly 59. The second guiding subassembly 59 includes two pairs of mounting seats 591 mounted on the main body 511 and a second guiding shaft 593. One pair of the mounting seats 591 is positioned on opposite ends of the transmission portion 563, and the transmission portion 563 is movably mounted on the mounting seats 591 along the longitudinal direction. The other pair of the mounting seats 591 are securely positioned on opposite ends of the second guiding shaft 593. The second guiding shaft 593 passes through the second mounting hole 5513 and the second guiding hole 5313, and thus the second limiting members 53 and the second correction members 55 are mounted on the second guiding shaft 593. Thus, the second correction members 55 are guided by the second guiding shaft 593.

The pick-and-place mechanism 300 is movably mounted above the first correction mechanism 30 and the second correction mechanism 50, and is configured for picking up the pins from the correction mechanism 200 and placing down the pins on the correction mechanism 200. In the illustrated embodiment, the pick-and-place mechanism 300 is a robot arm.

In assembly, the first correction assembly 30 is mounted on the mounting board 10 adjacent to the end of the rail 11. Then, the second correction assembly 50 is mounted on the rails 11 of the mounting board 10, the first driving member 57 is positioned on the mounting board 10 adjacent to the other end of the rail 11 away from the first correction assembly 30, and free ends of the second limiting portions 532 and the second correction portions 553 are positioned adjacent to and above the first limiting portions 332 and the first correction portions 353.

FIG. 3 shows the correction device 100 in use. The pins to be corrected are placed on the first correction assembly 30 by the pick-and-place mechanism 300, and one end of each pin is placed between the first limiting portion 332 and the first correction portion 353 adjacent to the first limiting member 33. The first correction members 35 move toward the first limiting members 33 along a direction X (first direction), and the ends of the pins are clamped between the first correction portions 353 and the first limiting portions 332, and are limited or restrained along the direction X. Then, the support member 51 moves toward the first correction assembly 30 driven by the first driving member 57, such that the second limiting portions 532 and the second correction portions 553 are staggered above with the first limiting portions 332 and the first correction portions 353, and the other end of each pin is between the second limiting portion 532 and the second correction portion 553. The second correction members 55 moves toward the second limiting members 53 along a direction Y (second direction) substantially perpendicular to the direction X, and the other ends of the pins are clamped between the second correction portions 553 and the second limiting portions 532, and are limited or restrained along the direction Y. Last, the pins are taken out by the pick-and-place mechanism 300, the alignment of the pins is corrected by a friction force exerted between the pins and the first limiting portions 332, the first correction portions 353, the second limiting portions 532, or the second correction portions 553.

Because the pins are limited or restrained along both the direction X and the direction Y, bent portions of the pins deviating from the direction X and another bent portions of the pins deviating from the direction Y can be corrected once, and a correction efficiency of the pin alignment is relatively high.

In other embodiments, the pick-and-place mechanism 300 can be omitted, and the pins are picked and placed by hand. The first guiding subassembly 39 and the second guiding subassembly 59 can be omitted. The first driving member 57 can be omitted, and the second limiting portions 532 and the second correction portions 553 are directly placed above and staggered with the first limiting portions 332 and the first correction portions 353. The support members 31, 51 can be omitted, and the first limiting members 33, the first correction members 35, the second limiting members 53, and the second correction members 55 are mounted on the mounting board 10. The first transmission shaft 37 and the second transmission shaft 56 can be omitted, and the driving members 38, 58 are directly connected to the first correction members 35, and the second correction members 55, respectively.

While various embodiments have been described and illustrated, the disclosure is not to be construed as being restricted thereto. Various modifications can be made to the embodiments by those skilled in the art without departing from the true spirit and scope of the disclosure as defined by the appended claims.

What is claimed is:

1. A correction device for correcting the alignment of pins, the correction device comprising:
   a correction mechanism comprising:
      a mounting board;
      a first correction assembly comprising a plurality of first limiting members and a plurality of first correction members, the plurality of first correction members are alternating arranged with the plurality of first limiting members, wherein the plurality of first limiting members are securely fixedly mounted on the mounting board, the plurality of first correction members are movably mounted on the mounting board, and capable of moving toward the plurality of first limiting members along a first direction, so that the pins are clamped by and restrained between the plurality of first limiting members and the plurality of first correction members along the first direction; and
      a second correction assembly comprising a plurality of second limiting members and a plurality of second correction members alternatingly arranged with the plurality of second limiting members, wherein the plurality of second limiting members are securely fixedly mounted on the mounting board, the plurality of second correction members are movably mounted on the mounting board and capable of moving toward the plurality of second limiting members along a second direction, the plurality of second limiting members and the plurality of second correction members are arranged substantially perpendicular to and above the plurality of first limiting members and the plurality of first correction members, such that the pins are clamped by and restrained between the plurality of second limiting members and the plurality of second correction members along the second direction being substantially perpendicular to the first direction; and
   a pick-and-place mechanism movably positioned above the correction mechanism.

2. The correction device of claim 1, wherein each of the plurality of first limiting members comprises a fixing portion securely fixedly mounted on the mounting board and a first limiting portion extending from the fixing portion, each of the plurality of first correction members comprises a mounting portion movably mounted on the mounting board and a first correction portion extending from the mounting portion, the first correction portion is aligned parallel to the first limiting portion.

3. The correction device of claim 2, wherein the first correction assembly further comprises a driving member securely connected to the mounting portion of each of the plurality of first correction members, for driving the plurality of first correction members to move toward the plurality of first limiting members.

4. The correction device of claim 3, wherein the first correction assembly further comprises a first transmission shaft, the first transmission shaft comprises a connection portion connected to the driving member and a transmission portion extending from the connection portion, the transmission portion passes through the plurality of first limiting members and the plurality of first correction members, and the transmission portion is securely fixedly connected to the plurality of first correction members, such that the plurality of first correction members are connected to the driving member.

5. The correction device of claim 4, wherein a first through hole is defined in the fixing portion, a first mounting hole is defined in the mounting portion according to the first through hole, the transmission portion passes through the first through hole and the first mounting hole, and is fixed to inner wall of the first mounting hole.

6. The correction device of claim 4, wherein each of the plurality of first limiting members further comprises a tab, and the tab is securely fixedly mounted on the mounting board.

7. The correction device of claim 1, wherein the mounting board comprises a main body and a rail mounted on the main body, the rail is substantially perpendicular to the plurality of first limiting members and the plurality of first correction members, the second correction assembly further comprises a support member, the support member is movably mounted on the rail along the first direction, and the plurality of second limiting members are securely fixedly mounted on the support member.

8. The correction device of claim 7, wherein the second correction assembly further comprises a first driving member securely fixedly mounted on the main body, and the first driving member is securely connected to the support member.

9. The correction device of claim 7, wherein the second correction assembly further comprises a second driving member securely fixedly mounted on the support member, the second driving member is securely connected to the plurality of second correction members.

10. The correction device of claim 1, wherein the pick-and-place mechanism comprises a robot arm.

11. A correction mechanism comprising:
   a mounting board;
   a first correction assembly comprising a plurality of first limiting members and a plurality of first correction members alternatingly arranged with the plurality of first limiting members, wherein the plurality of first limiting members are securely fixedly mounted on the mounting board, the plurality of first correction members are movably mounted on the mounting board and capable of moving toward the plurality of first limiting members along a first direction; and
   a second correction assembly comprising a plurality of second limiting members, and a plurality of correction members alternatingly arranged with the plurality of second limiting members, wherein the plurality of second limiting members are securely fixedly mounted on the mounting board, the plurality of second correction members are movably mounted on the mounting board and capable of moving toward the plurality of second limiting members along a second direction substantially perpendicular to the first direction, the plurality of second limiting members and the plurality of second correction members are substantially perpendicular to and above the plurality of first limiting members and the plurality of first correction members.

12. The correction device of claim 11, wherein each of the plurality of first limiting members comprises a fixing portion securely fixedly mounted on the mounting board and a first limiting portion extending from the fixing portion, each of the plurality of first correction members comprises a mounting portion movably mounted on the mounting board and a first correction portion extending from the mounting portion, and the first correction portion is aligned parallel to the first limiting portion.

13. The correction mechanism of claim 12, wherein the first correction assembly further comprises a driving member securely connected to the mounting portion of each of the plurality of first correction members, for driving the plurality of first correction members to move toward the plurality of first limiting members.

14. The correction mechanism of claim 13, wherein the first correction assembly further comprises a first transmission shaft, the first transmission shaft comprises a connection portion connected to the driving member and a transmission portion extending from the connection portion, the transmission portion passes through the plurality of first limiting members and the plurality of first correction members, and the transmission portion is securely fixedly connected to the plurality of first correction members, such that the plurality of first correction members are connected to the driving member.

15. The correction mechanism of claim 14, wherein a first through hole is defined in the fixing portion, a first mounting hole is defined in the mounting portion according to the first through hole, the transmission portion passes through the first through hole and the first mounting hole, and is fixed to inner wall of the first mounting hole.

16. The correction mechanism of claim 14, wherein each of the plurality of first limiting members further comprises a tab, and the tab is securely fixedly mounted on the mounting board.

17. The correction mechansim of claim 11, wherein the mounting board comprises a main body and a rail mounted on the main body, the rail is substantially perpendicular to the plurality of first limiting members and the plurality of first correction members, the second correction assembly further comprises a support member, the support member is movably mounted on the rail along the first direction, the plurality of second limiting members are securely fixedly mounted on the support member.

18. The correction mechanism of claim 17, wherein the second correction assembly further comprises a first driving member securely fixedly mounted on the main body, the first driving member is securely connected to the support member.

19. The correction mechansim of claim 17, wherein the second correction assembly further comprises a second driving member securely fixedly mounted on the support member, the second driving member is securely connected to the plurality of second correction members.

20. The correction mechansim of claim 17, wherein the first correction assembly further comprises a first guiding subassembly, the first guiding subassembly comprises a first guiding shaft passing through the plurality of first limiting members and the plurality of first correction members.

* * * * *

UNITED STATES PATENT AND TRADEMARK OFFICE
CERTIFICATE OF CORRECTION

PATENT NO. : 9,549,492 B2  
APPLICATION NO. : 13/854158  
DATED : January 17, 2017  
INVENTOR(S) : Bing Li et al.

Page 1 of 1

It is certified that error appears in the above-identified patent and that said Letters Patent is hereby corrected as shown below:

On the Title Page

Please replace Item (73) regarding "Assignees" with the following:
(73) HONG FU JIN PRECISION INDUSTRY (SHENZHEN) CO., LTD., Shenzhen (CN)
HON HAI PRECISION INDUSTRY CO., LTD., New Taipei (TW)

Signed and Sealed this
Twentieth Day of June, 2017

Joseph Matal
*Performing the Functions and Duties of the*
*Under Secretary of Commerce for Intellectual Property and*
*Director of the United States Patent and Trademark Office*